(12) United States Patent
Cheon

(10) Patent No.: US 8,643,052 B2
(45) Date of Patent: Feb. 4, 2014

(54) LIGHT EMITTING DIODE COMPRISING SEMICONDUCTOR NANOCRYSTAL COMPLEXES

(75) Inventor: Kwang-Ohk Cheon, Latham, NY (US)

(73) Assignee: Samsung Electronics Co., Ltd. (KR)

( * ) Notice: Subject to any disclaimer, the term of this patent is extended or adjusted under 35 U.S.C. 154(b) by 5 days.

(21) Appl. No.: 13/446,752

(22) Filed: Apr. 13, 2012

(65) Prior Publication Data

US 2012/0205621 A1 Aug. 16, 2012

Related U.S. Application Data

(63) Continuation of application No. 11/485,334, filed on Jul. 13, 2006, now Pat. No. 8,168,994.

(60) Provisional application No. 60/698,642, filed on Jul. 13, 2005.

(51) Int. Cl.
*H01L 33/00* (2010.01)

(52) U.S. Cl.
USPC ..................... 257/99; 257/E33.059

(58) Field of Classification Search
USPC .................. 257/94, 98, 99, 100, 81, E25.032, 257/E33.059
See application file for complete search history.

(56) References Cited

U.S. PATENT DOCUMENTS

| | | | |
|---|---|---|---|
| 6,057,561 A | 5/2000 | Kawasaki et al. | |
| 6,501,091 B1 | 12/2002 | Bawendi et al. | |
| 6,734,465 B1 | 5/2004 | Taskar et al. | |
| 6,803,719 B1 | 10/2004 | Miller et al. | |
| 6,861,155 B2 | 3/2005 | Bawendi et al. | |
| 6,890,777 B2 | 5/2005 | Bawendi et al. | |
| 6,914,265 B2 | 7/2005 | Bawendi et al. | |
| 7,264,527 B2 | 9/2007 | Bawendi et al. | |
| 7,294,861 B2 | 11/2007 | Schardt et al. | |
| 2001/0051022 A1 | 12/2001 | Kondo et al. | |
| 2003/0127660 A1 | 7/2003 | Bawandi et al. | |
| 2003/0214233 A1 | 11/2003 | Takahashi et al. | |
| 2004/0124429 A1 | 7/2004 | Stokes et al. | |
| 2004/0233664 A1 | 11/2004 | Beeson et al. | |
| 2005/0001538 A1 | 1/2005 | Ozkan et al. | |
| 2005/0098787 A1 | 5/2005 | Andrews | |
| 2005/0126628 A1 | 6/2005 | Scher et al. | |
| 2006/0068154 A1* | 3/2006 | Parce et al. | 428/76 |

(Continued)

OTHER PUBLICATIONS

PCT Notification Concerning Transmittal of International Preliminary Report on Patentability (Chapter 1 of the PCT Treaty and PCT Written Opinion of the International Searching Authority (5 pages), Chapter 1 on Jan. 24, 2008, written opinion on May 3, 2007.

*Primary Examiner* — Selim Ahmed
(74) *Attorney, Agent, or Firm* — Cantor Colburn LLP

(57) ABSTRACT

A light emitting diode (LED) formed by depositing an LED chip and coupling a stability layer to the LED chip. Semiconductor nanocrystals are placed in a first matrix material to form a nanocrystal complex layer. The nanocrystal complex layer is deposited on top of the stability layer. A thickness of the stability layer is chosen to maximizes a power of a light output by the nanocrystal complex layer. The matrix material and the stability layer can be of the same type of material. Additional layers of matrix material can be deposited on top of the nanocrystal complex layer. These additional layers can comprise matrix material only or can comprise matrix material and semiconductor nanocrystals to form another nanocrystal complex layer.

10 Claims, 6 Drawing Sheets

(56) References Cited

U.S. PATENT DOCUMENTS

2006/0110279 A1* 5/2006 Han et al. .................. 420/523
2007/0004065 A1* 1/2007 Schardt et al. .................. 438/26
2007/0045777 A1 3/2007 Gillies et al.

* cited by examiner

LIGHT EMITTING DIODE COMPRISING SEMICONDUCTOR NANOCRYSTAL COMPLEXES

CROSS-REFERENCE TO RELATED APPLICATIONS

This application is a continuation application of patent application Ser. No. 11/485,334 filed on Jul. 13, 2006, which claims priority to U.S. Provisional Application No. 60/698,642, filed Jul. 13, 2005, the entire contents of which are incorporated by reference herein.

FIELD OF THE INVENTION

The present invention relates to light emitting diodes and particularly to light emitting diodes comprising semiconductor nanocrystal complexes. The present invention also relates to methods of making light emitting diodes comprising semiconductor nanocrystal complexes.

BACKGROUND OF THE INVENTION

Semiconductor nanocrystals are typically tiny crystals of II-VI, III-V, IV-VI materials that have a diameter approximately between 1 nanometer (nm) and 20 nm. In the strong confinement limit, the physical diameter of the nanocrystal is smaller than the bulk excitation Bohr radius causing quantum confinement effects to predominate. In this regime, the nanocrystal is a 0-dimensional system that has both quantized density and energy of electronic states where the actual energy and energy differences between electronic states are a function of both the nanocrystal composition and physical size. Larger nanocrystals have more closely spaced energy states and smaller nanocrystals have the reverse. Because interaction of light and matter is determined by the density and energy of electronic states, many of the optical and electric properties of nanocrystals can be tuned or altered simply by changing the nanocrystal geometry (i.e., the physical size).

Single nanocrystals or monodisperse populations of nanocrystals exhibit unique optical properties that are size tunable. Both the onset of absorption and the photoluminescent wavelength are a function of nanocrystal size and composition. The nanocrystals will absorb all wavelengths shorter than the absorption onset, however, photoluminescence will always occur at the absorption onset. The bandwidth of the photoluminescent spectra is due to both homogeneous and inhomogeneous broadening mechanisms. Homogeneous mechanisms include temperature dependent Doppler broadening and broadening due to the Heisenburg uncertainty principle, while inhomogeneous broadening is due to the size distribution of the nanocrystals. The narrower the size distribution of the nanocrystals, the narrower the full-width half max (FWHM) of the resultant photoluminescent spectra. In 1991, Brus wrote a paper reviewing the theoretical and experimental research conducted on colloidally grown semiconductor nanocrystals, such as cadmium selenide (CdSe) in particular (Brus, L., *Quantum Crystallites and Nonlinear Optics*, Applied Physics A, vol. 53 (1991)). That research, precipitated in the early 1980's by the likes of Efros, Ekimov, and Brus himself, greatly accelerated by the end of the 1980's as demonstrated by the increase in the number of papers concerning colloidally grown semiconductor nanocrystals.

Drivers for the growth of high quality semiconductor nanocrystals include demand for large screen televisions, outdoor/landscape lighting luminaires, interior illumination in the transportation sector (e.g., airplanes, subways, ships, etc.), and in particular, automobiles. The demand for much higher quality white light emitting diodes (LEDs) should begin to grow significantly in 2008, when automotive manufacturers have committed to introducing models with white LED forward lighting.

DETAILED DESCRIPTION OF THE INVENTION

Figure 1:
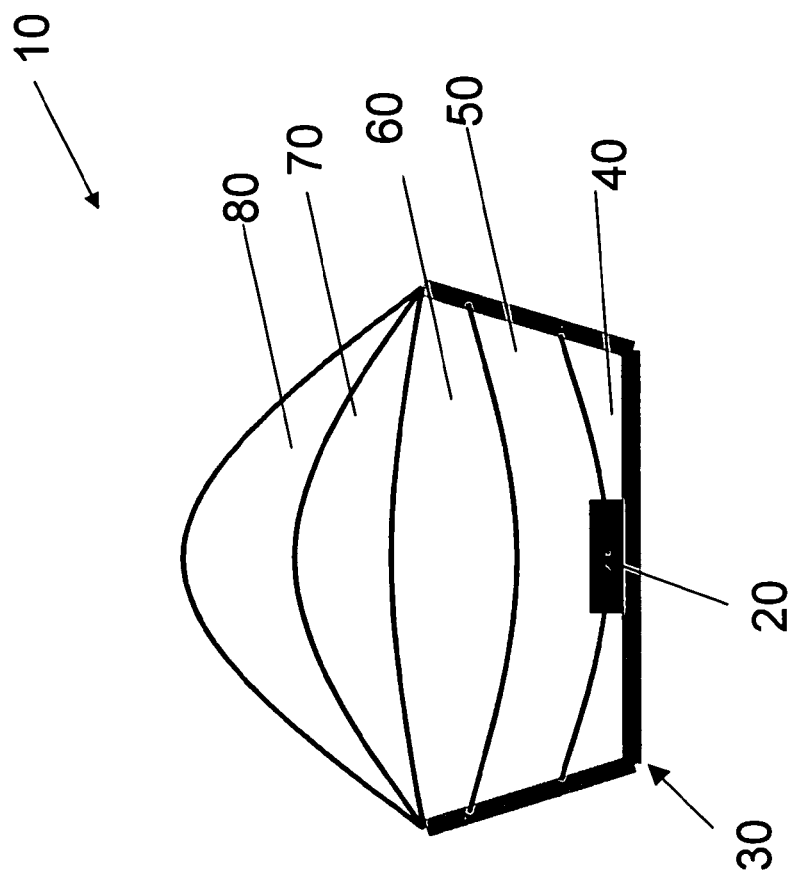
FIG. 1 is a schematic illustration of an LED device.

The present invention relates to an LED device comprising quantum dots. FIG. 1 represents an example LED device comprising quantum dots. The LED device may include, for example, an LED chip placed in the bottom of an LED cup. Each successive layer of the LED device may then be placed into the LED cup. The layers may each comprise a matrix material that either does or does not comprise quantum dots. Although the figure is shown as comprising five layers, the present invention is not limited as such. For example, six layers or more may be added to form an LED device according to an aspect of the present invention. Further, an LED device of the present invention may be formed with fewer than five layers.

FIG. 1 depicts a light emitting device 10 according to an example embodiment of the present invention. The light emitting device 10 may comprise a diode chip 20, a housing 30, a stability layer 40, and a nanocrystal complex layer 50. Additionally, the light emitting device may comprise various layers of matrix materials 50, 60, 70 and 80. The diode chip 20 may be any LED chip. Typically, diode chip 20 may be prepared from gallium-based crystals that contain one or more additional materials such as phosphorous. For example, the following materials may be used for the preparation of diode chip 20: AlInGaP, for red, orange, yellow, and green; AlGaAs, for red and infrared; AlGaP, for green; GaAsP, for red, orange, and yellow; GaP, for red, yellow and green; GaN, for green, and blue; and InGaN, for near ultraviolet and blue.

The LED chip should be selected such that it emits light at an energy that is capable of exciting the semiconductor nanocrystal complex contained within the LED device. The housing 30 contains the diode chip 20, as well as the stability layer 40, and the nanocrystal complex layer 50. There are many types of housing used in light emitting devices. These housing are available in many shapes and sizes depending on the application for the lighting device. Stability layer 40 represents a layer to be optically coupled to the diode chip 20. This layer acts to dissipate the heat produced from the diode chip 20 and increases the stability of the light emitted by the nanocrystal complex layer 50. Semiconductor nanocrystals tend to degrade over time, when placed in LED devices. In turn, this degradation results in a reduction of the quantum yield of the underlying device and red shift of the light emitting by the semiconductor nanocrystals. The stability layer may be made substantially free of semiconductor nanocrystal complex. Typical matrix materials used in the production of LED devices include organic and water based solvents into which a binding agent and an adhesive have been added. Example matrix materials that may be used in the present invention include, but are not limited to, urethane/acrylate, butyl acetate and xylol. Additionally, silicones, epoxies and polymers may be used, as a matrix material. Layer 40 should allow for the dissipation of the heat produced by the diode chip 20. The stability layer 40 allows for the creation of brighter devices comprising semiconductor nanocrystals.

The stability layer 40 should be of a thickness such that it substantially maximizes light output from the semiconductor nanocrystal layer 50. As stated above, semiconductor nanocrystal layers 50 that are too close to the diode chip 20 result in a decrease in quantum yield. As the thickness of the stability layer 40 increases, the distance between the semiconductor nanocrystal layer 50 and the diode chip 20 would also increase. However, if this distance is too great then the light output from the device would also decrease. Thus, the stability layer 40 should be of a thickness that maximizes the light output by the semiconductor nanocrystal layer 50. Depending on the size and shape of the housing 30 and the diode chip 20, the thickness of the stability layer 40 may vary. However, in each case the optimal distance may be experimentally determined as described below.

Semiconductor nanocrystal layer 50 represents a second matrix material that comprises semiconductor nanocrystal complexes. The second matrix material is preferably the same matrix material as the first matrix material. Typical matrix materials used in the production of LED devices include, but are not limited to, organic and water based solvents into which a binding agent and an adhesive have been added. Example matrix materials that may be used in the present invention include urethane/acrylate, butyl acetate and xylol. Additionally, silicones, epoxies and polymers may be used as a matrix material. The semiconductor nanocrystal complexes of the present invention should be able to be dispersed in the second matrix material.

Semiconductor nanocrystal complexes comprise a semiconductor nanocrystal core (also known as a semiconductor nanoparticle or semiconductor quantum dot) having an outer surface. A semiconductor nanocrystal core may comprise spherical nanoscale crystalline materials (although oblate and oblique spheroids can be grown as well as rods and other shapes) having a diameter of less than the Bohr radius for a given material and typically, but not exclusively, comprise II-IV, III-V, and IV-VI binary semiconductors. Non-limiting examples of semiconductor nanocrystal core include ZnS, ZnSe, ZnTe, CdS, CdSe, CdTe, HgS, HgSe, HgTe (II-VI materials), PbS, PbSe, PbTe (IV-VI materials), AlN, AlP, AlAs, AlSb, GaN, GaP, GaAs, GaSb, InN, InP, InAs, InSb (III-V materials). In addition to binary semiconductors, a semiconductor nanocrystal core may comprise ternary semiconductor materials. Non-limiting examples of ternary semiconductor materials include AxByC wherein A and/or B may comprise a group II, III, or IV element, C may comprise a group V or VI element, and x and y are molar fractions between 0 and 1. In addition to a semiconductor nanocrystal core, the semiconductor nanocrystal complex may comprise either one or more metal layers or shell layers grown around the semiconductor nanocrystal cores.

The shells may provide for a type A semiconductor nanocrystal complex 50. Shells may comprise various different semiconductor materials such as, for example, CdSe, CdS, CdTe, ZnS, ZnSe, ZnTe, HgS, HgSe, HgTe, InP, InAs, InSb, InN, GaN, GaP, GaAs, GaSb, PbSe, PbS, and PbTe.

Semiconductor nanocrystal cores, metal layers and/or shells may be grown by the pyrolysis of organometallic precursors in a chelating ligand solution or by an exchange reaction using the prerequisite salts in a chelating ligand solution. The chelating ligands are typically lyophilic and have an affinity moiety for the metal layer and another moiety with an affinity toward the solvent, which is usually hydrophobic. Typical examples of chelating ligands include lyophilic surfactant molecules such as Trioctylphosphine oxide (TOPO), Trioctylphosphine (TOP), and Tributylphosphine (TBP).

Semiconductor nanocrystal complexes should be selected such that they absorb at least a portion of the light emitted by the diode chip 20 and emit light at a second wavelength.

Third layer 60, fourth layer 70 and fifth layer 80 are optional layers in the production of an LED device according to the present invention. These layers are made of matrix material and may or may not comprise semiconductor nanocrystal complexes.

In light of the above, the present invention relates to an LED device wherein a stability layer is present below a second layer comprising a matrix material and a population of semiconductor nanocrystal complexes. Thereafter, the LED device of the present invention may comprise further layers of matrix materials with or without semiconductor nanocrystals.

Example LED Device of the Present Invention

Figure 2:
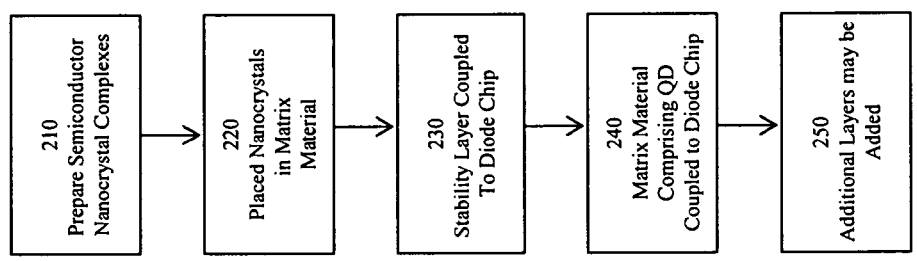
FIG. 2 is a schematic illustration of a method of making an LED according to an embodiment of the present invention.

FIG. 2 illustrates a method for preparing an LED comprising a semiconductor nanocrystal complex, according to an aspect of the present invention.

In step 210, the semiconductor nanocrystals are prepared and/or purchased. There are many known ways for the production of semiconductor nanocrystal. Additionally, semiconductor nanocrystals may be purchased for use in the present invention. The use of two semiconductor nanocrystal complexes would result in two populations of semiconductor nanocrystal emitting at two separate wavelengths in either the same or a different matrix material.

In step 220, the semiconductor nanocrystals are placed in a first matrix material. The semiconductor nanocrystal complexes prepared above are crashed out of a solution and separated from the solvent they are prepared in. As discussed above, there are many optical epoxies and matrix materials that may be used for the creation of an efficient LED. In the example procedure (semiconductor nanocrystal complexes created for the purpose of the example white light LED), urethane/acrylate was added onto the dried semiconductor nanocrystals. However, many optically clear matrix materials may be used for the production of the LED devices of the present invention.

In step 230, a stability layer of matrix material was placed in/on an LED cup. This stability layer may be the same as or different to the material for which the semiconductor nanocrystal complexes were placed into in step 220. It has been found that 1 μl of matrix material (e.g., urethane/acrylate) is enough to increase the efficiency and lifetime of the LED device; however, other amounts and/or layers may be desired depending on the size and shape of the LED cup.

In step 240, the matrix material comprising the semiconductor nanocrystal complex is deposited on the LED chip. There are many known ways to deposit matrix materials onto LED chips and the methods described below are not intended to be limiting. In an example LED according to an example embodiment of the present invention, 0.7 μl of semiconductor nanocrystal/matrix material (e.g., urethane/acrylate) may be added as the semiconductor nanocrystal layer.

In step 250, additional layers may be added as desired. These layers may or may not comprise semiconductor nanocrystals.

Example Device

CdSe/ZnS semiconductor nanocrystals in toluene were prepared using known techniques of nanocrystal preparation. The semiconductor nanocrystal complexes prepared above were crashed out of solution and separated from the solvent they were prepared in. There are many ways to crash semiconductor nanocrystals out of solution. For the preparation of the example LED, methanol was added to the prepared semiconductor nanocrystal. The volume of methanol added is about same as the volume of organic solvent containing the semiconductor nanocrystals. The solution was placed in a centrifuge at high speed (~20,000 rpm) for approximately 15 minutes. The solution can be discarded and the precipitate may then be dried under nitrogen. To further remove the semiconductor nanocrystals from the solvent, the remnant solvent may be dried or heated using a vacuum oven. The vacuum oven temperature may be heated to about 50° C.

The semiconductor nanocrystals were then be added to a matrix material. For the purpose of the example LED, urethane/acrylate was added onto the dried semiconductor nanocrystals. The solution was then sonicated for several hours to solvate the semiconductor nanocrystals in the urethane/acrylate matrix. After the solvating was complete, the urethane/acrylate matrix with the semiconductor nanocrystals is optically clear.

A stability layer was delivered on the LED Chip using a pipette. The LED chip used in the example is a TGEVID-466 nm device. The volume of urethane/acrylate delivered on the chip was 1 micro-liter, which can make 50 mm to 2000 mm film on the LED chip. The stability layer was cured using UV source Green Spot. Next, a second layer comprising semiconductor nanocrystals and 0.7 µl urethane/acrylate, prepared as discussed above, may be placed on the LED chip through the use of a pipette. The curing of the matrix material was accomplished with a high intensity UV source, if the curing is done in air. Alternatively, a lower energy source can be used if the curing is done in a relatively oxygen-free environment. Using the above described method, a semiconductor nanocrystal matrix material or additional matrix material may be layered on top of the second layer comprising semiconductor nanocrystals and a matrix material.

The below experimentation was conducted using semiconductor nanocrystals emitting at 620 nm placed in various layers man LED chip. In addition to altering the layers and the placement of the encapsulation layer comprising quantum dots, the thickness of the layers was varied to determine the optimal layer thickness for the stability layer and the semiconductor complex layer.

The semiconductor nanocrystal complexes were each placed in urethane/acrylate with a concentration of 2 mg of semiconductor nanocrystal per ml of matrix material. The matrix material was urethane/acrylate, however, as previously mentioned, other matrix materials may have been used such as butyl acetate and xylol (either with the semiconductor nanocrystals or without them). The semiconductor nanocrystal complexes were stacked in the LED cup, as depicted in FIG. 1. Although the LED represented in the figure is a particular type of LED, the present invention may apply to various other LED configurations. The volume of the LED cup used for the experimental results was 3±1 µl. Each time a layer was coupled to the diode chip, whether comprising semiconductor nanocrystals or not, it was counted as a layer. The configuration for six tested samples are detailed below, in Table 1.

TABLE 1

Samples
As shown in Table 1, sample Cp011 comprises a control that was measured in each step. A step refers to the addition of the next layer of material. In addition to the control, each sample was measured in each step. All measurements were done in an integrating sphere and the samples were connected in series to supply the same current to each LED. All the data was normalized by the intensity of the control sample Cp011.

| Sample | Layer 0 | Layer 1 | Layer 2 | Layer 3 | Layer 4 | Layer 5 | Layer 6 |
|---|---|---|---|---|---|---|---|
| Cp011 | None | None | None | None | None | None | None |
| Cp012 | None | OP54 = 1 µl | OP54 = 1 µl | OP54 = 1 µl | OP54 = 2 µl | OP54 = 2 µl | OP54 = 2 µl |
| Cp006 | None | SQD = 0.7 µl | OP54 = 1.5 µl | OP54 = 1.5 µl | OP54 = 1.5 µl | OP54 = 1.5 µl | |
| Cp013 | None | OP54 = 1 µl | SQD = 0.7 µl | OP54 = 1 µl | OP54 = 2 µl | OP54 = 2 µl | OP54 = 2 µl |
| Cp014 | None | OP54 = 2 µl | SQD = 0.7 µl | OP54 = 1 µl | OP54 = 2 µl | OP54 = 2 µl | OP54 = 2 µl |
| Cp015 | None | OP54 = 3 µl | SQD = 0.7 µl | OP54 = 1 µl | OP54 = 2 µl | OP54 = 2 µl | OP54 = 2 µl |

Sample Cp012 was prepared with a first layer of 1 µl urethane/acrylate, a second layer of 1 µl urethane/acrylate, a third layer of 1 µl urethane/acrylate, a fourth layer of 2 µl urethane/acrylate, a fifth layer of 2 µl urethane/acrylate and a sixth layer of 2 µl urethane/acrylate. Sample Cp006 was prepared with a first layer of semiconductor nanocrystals and 0.7 µl urethane/acrylate, a second layer of 1.5 µl urethane/acrylate, a third layer of 1.5 µl urethane/acrylate, a fourth layer of 1.5 µl urethane/acrylate, and a fifth layer of 1.5 µl urethane/acrylate. Sample Cp013 was prepared with a first layer of 1 µl urethane/acrylate, a second layer comprising semiconductor nanocrystals and 0.7 µl urethane/acrylate, a third layer of 1 µl urethane/acrylate, a fourth layer of 2 µl urethane/acrylate, a fifth layer of 2 µl urethane/acrylate and a sixth layer of 2 µl urethane/acrylate. Sample Cp014 was prepared with a first layer of 2 µl urethane/acrylate, a second layer comprising semiconductor nanocrystals and 0.7 µl urethane/acrylate, a third layer of 1 µl urethane/acrylate, a fourth layer of 2 µl urethane/acrylate, a fifth layer of 2 µl urethane/acrylate and a sixth layer of 2 µl urethane/acrylate. Sample Cp015 comprises a first layer of 3 µl urethane/acrylate, a second layer comprising semiconductor nanocrystals and 0.7 µl urethane/acrylate, a third layer of 1 µl urethane/acrylate, a fourth layer of 2 µl urethane/acrylate, a fifth layer of 2 µl urethane/acrylate and a sixth layer of 2 µl urethane/acrylate.

Figure 3:
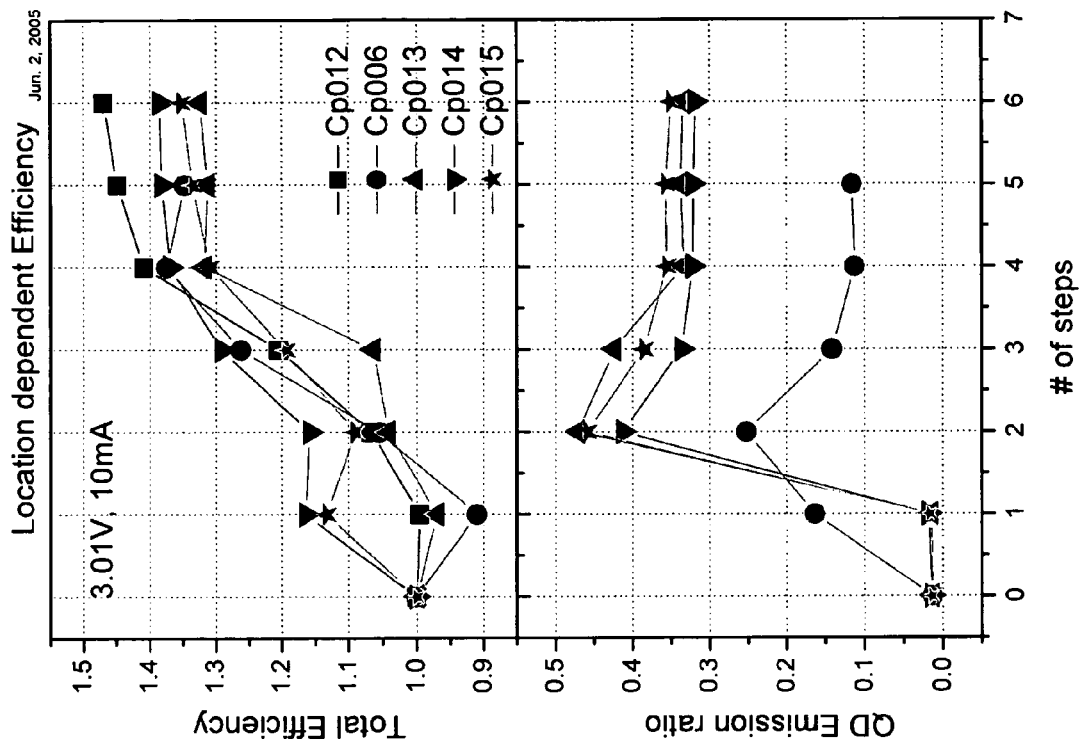
FIG. 3 depicts the total efficiency (source emission+semiconductor nanocrystal complex emission) and semiconductor nanocrystal complex emission ratio ((semiconductor nanocrystal complex emission)/(Total emission)).

Each of the above described semiconductor nanocrystals were measured to determine the overall efficiency and the semiconductor nanocrystal complex emission ratio. FIG. 3 shows the total efficiency (source emission+semiconductor nanocrystal complex emission) and semiconductor nanocrystal complex emission ratio ((semiconductor nanocrystal complex emission)/(Total emission)). The total efficiency was then directly converted to power. The devices were operated at 3.01 volts and 10 mA to ensure that the diode chip would be operable. The efficiency was calculated as follows. For example, if in the original LED Chip, the control, the power was measured to be 6 mW at Step 0, then the power of Cp012 is estimated about 8.9 mW at Step 6. As can be seen from the graph, the addition of the urethane/acrylate layers increases the efficiency of the device.

The efficiency (or power) of all samples is enhanced with increased number of steps (or layers). The sample without any semiconductor nanocrystals (Cp012) has an efficiency 1 at Step 0, and an enhanced efficiency of 1.48 at Step 6. With few exceptions, all other samples show a similar trend as shown by Cp012. For reference, the total efficiency of Cp014(pink color) is about 95% with semiconductor nanocrystal conversion efficiency approximately 85% at Step 6. The total efficiency of all the devices comprising a layer of semiconductor nanocrystal complex was between 80% and 95% of sample Cp012. Depending on the LED chip used, the film geometry and the amount of semiconductor nanocrystals used in the loading, the numbers/results may vary.

The quantum dot emission ratio graph of FIG. 3 shows a dramatic change in the semiconductor nanocrystal emission ratio between different locations of the semiconductor nanocrystal complex layer. For example, a comparison of Cp006 to Cp013, Cp014, and Cp015 shows that the nanocrystal complex layers emission ratio is significantly greater in the later three devices. Device Cp006 does not contain a stability layer, while the other devices each contain a stability layer (i.e., a urethane/acrylate layer). The stability layers for Cp013, Cp014, and Cp015 were added in Step 1 and were optically coupled to the LED diode before including a semiconductor nanocrystal complex layer. Arranging the LED in such a manner results in an almost two times improvement in quantum dot complex emission ratio.

Figure 4:
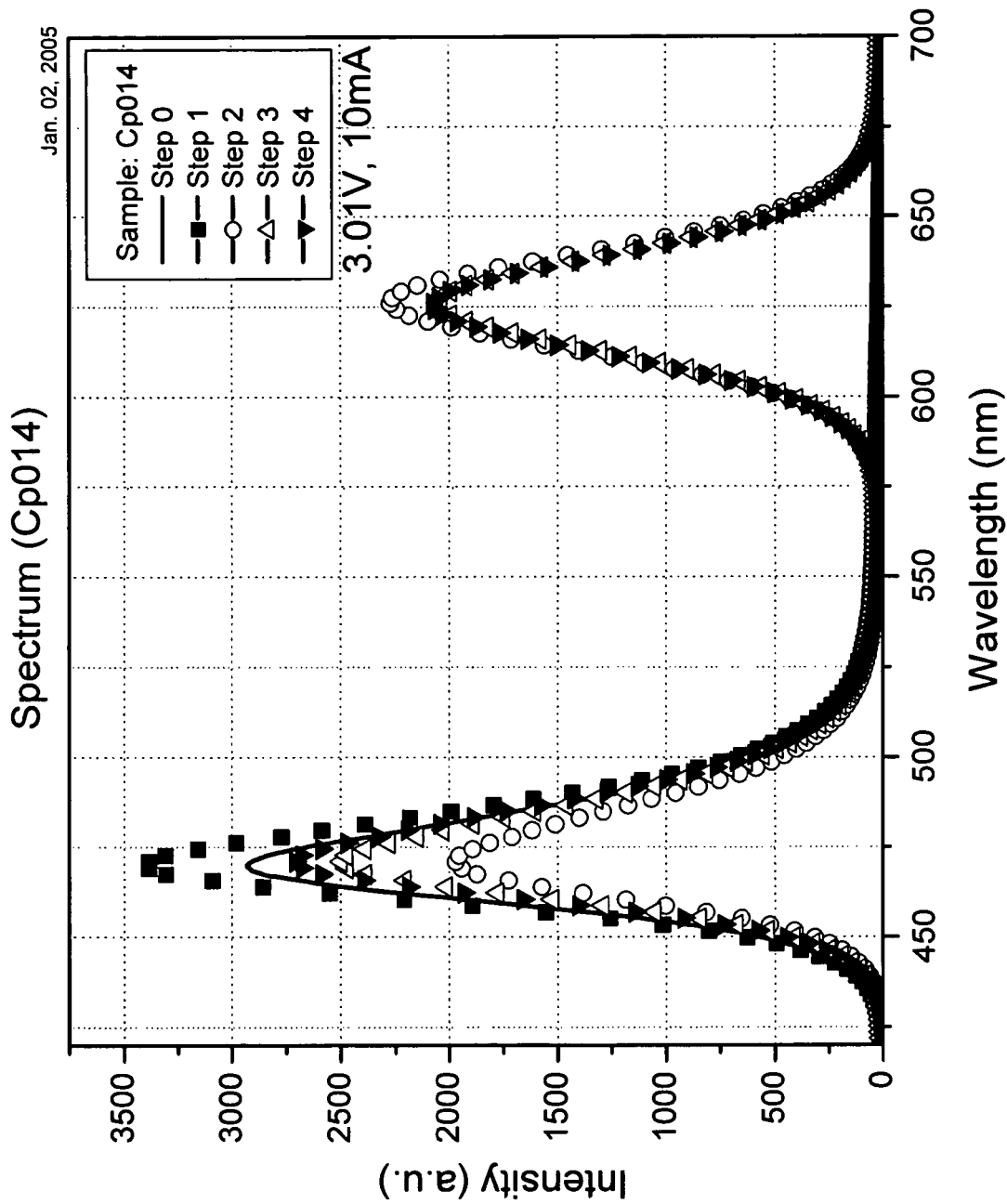
FIG. 4 depicts a typical spectrum response upon the addition of layers comprising matrix materials on top of the LED chip.

FIG. 4 shows a typical spectrum response of an LED device comprising a stability layer. FIG. 4 shows the intensity of the light emitted in regard to the device of sample Cp014. The emission from the nanocrystals is represented by the intensity peak at around 625 nm. As can be seen from Table 1, Steps 0 and 1 in device Cp014 do not contain a semiconductor nanocrystal layer. As such, no intensity peak is represented at approximately 620 nm for these steps. Once the nanocrystal complex layer has been added, the addition of additional matrix material layers are shown to increase the intensity of the emission from the diode chip, represented by the intensity peak at approximately 470 nm, but do not substantially effect the emission from the nanocrystal complex layer.

Figure 5:
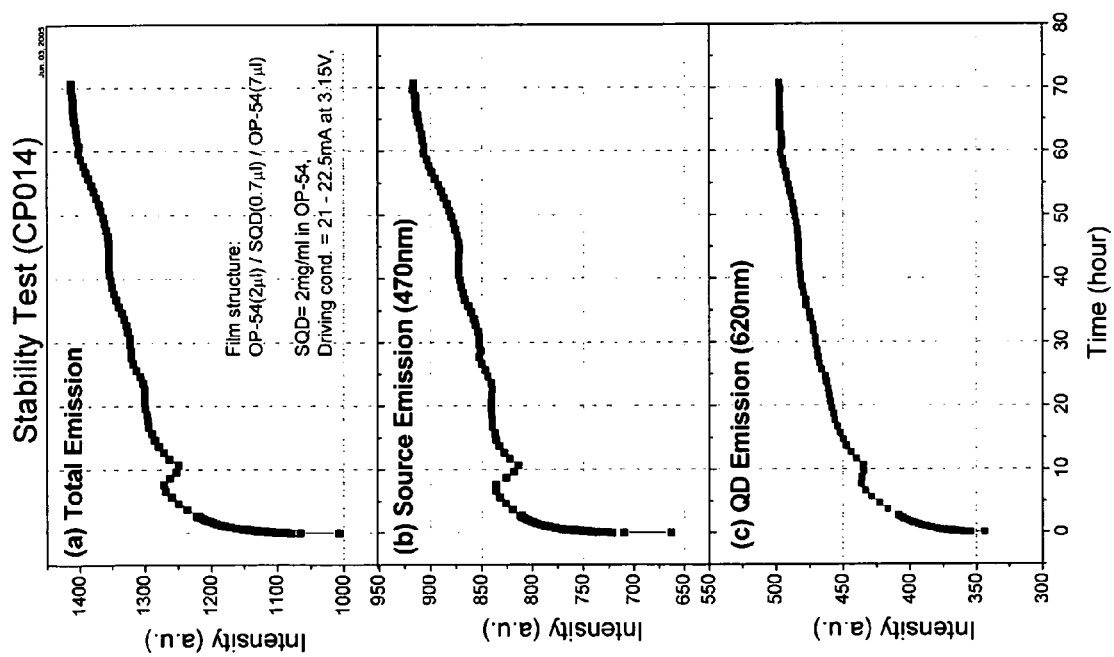
FIG. 5 depicts the lifetime of an LED made according to an embodiment of the present invention.
Figure 6:
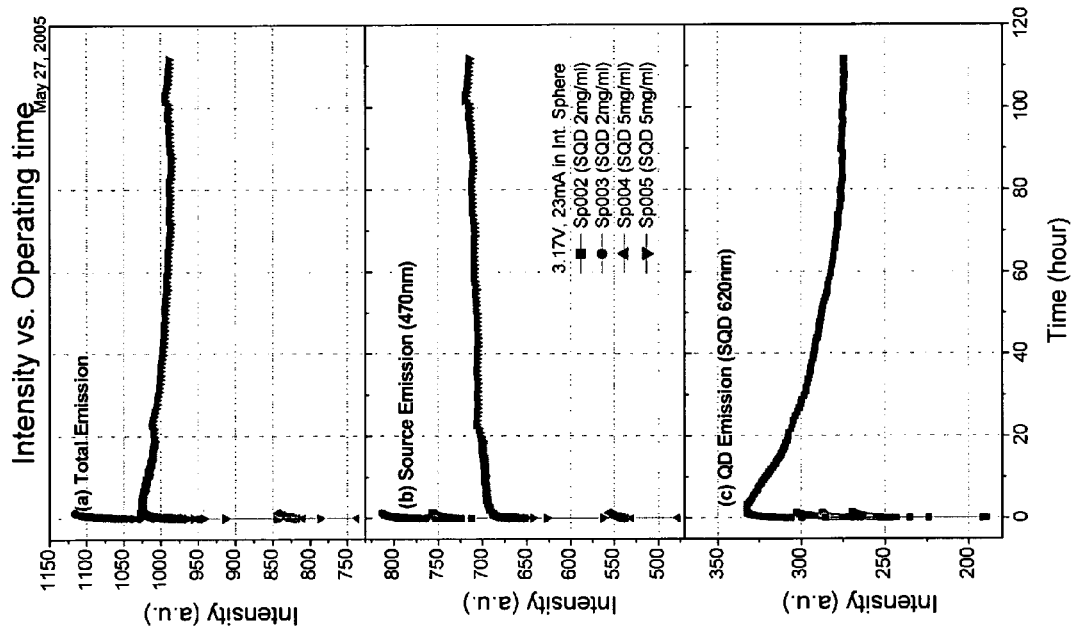
FIG. 6 depicts the lifetime of an LED device wherein the first layer comprises semiconductor nanocrystals dispersed in a matrix material.

FIG. 5, shows the lifetime of an LED made according to an embodiment of the present invention. In contrast to LED devices wherein a semiconductor nanocrystal complex is placed directly on top of an LED chip, the total emission, quantum dot emission, and source emission each do not decrease over time when a stability layer is present. In fact, the total emission, source emission, and the nanocrystal complex emission are each shown to increase over time. FIG. 6, shows the lifetime of an LED device made wherein the semiconductor nanocrystal/matrix layer is optically coupled to a diode without the presence of a stability layer. As can be seen from the graph, as the time increases, the quantum dot emission is reduced. Thus, FIGS. 5 and 6 show that the addition of a stability layer results in a longer lasting LED device.

The foregoing description and examples have been set forth merely to illustrate the invention and are not intended as being limiting. Each of the disclosed aspects and embodiments of the present invention may be considered individually or in combination with other aspects, embodiments, and variations of the invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention. Furthermore, all references cited herein are incorporated by reference in their entirety.

What is claimed is:

1. A light emitting diode (LED) comprising:
an LED chip;
a stability layer directly contacting the LED chip, the stability layer comprising a first matrix material; and
a nanocrystal complex layer over the stability layer and in direct contact with the stability layer, the nanocrystal complex layer comprising a semiconductor nanocrystal complex and a second matrix material, wherein the stability layer is substantially free of semiconductor nanocrystal complexes, and the first matrix material is the same as the second matrix material, and wherein the stability layer has a concave shape; with a concave curvature contacting the nanocrystal complex layer.

2. The LED of claim 1, wherein the stability layer is between the LED chip and the nanocrystal complex layer.

3. The LED of claim 1, further comprising at least one matrix material layer.

4. The LED of claim 3, wherein the at least one matrix material layer is over the nanocrystal complex layer.

5. The LED of claim 1, wherein the semiconductor nanocrystal complex comprises a semiconductor nanocrystal core.

6. The LED of claim 5, wherein the semiconductor nanocrystal core comprises a binary semiconductor.

7. The LED of claim 5, wherein the semiconductor nanocrystal core comprises a ternary semiconductor.

8. The LED of claim 1, wherein the semiconductor nanocrystal complex absorbs energy at a first wavelength emitted by the LED chip and emits energy at a second wavelength.

9. The LED of claim 1, wherein the stability layer and the first matrix material or the second matrix material comprise the same type of material.

10. The LED of claim 1, wherein the first matrix material and the second matrix material is a urethane acrylate.

* * * * *